United States Patent [19]
Hauf et al.

[11] Patent Number: 5,824,580
[45] Date of Patent: Oct. 20, 1998

[54] METHOD OF MANUFACTURING AN INSULATED GATE FIELD EFFECT TRANSISTOR

[75] Inventors: Manfred Hauf; Max G. Levy, both of Wappingers Falls; Victor Ray Nastasi, Hopewell Junction, all of N.Y.

[73] Assignees: International Business Machines Corporation, Armonk, N.Y.; Siemens Aktiengesellschaft, Munich, Germany

[21] Appl. No.: 688,346

[22] Filed: Jul. 30, 1996

[51] Int. Cl.⁶ .............................................. H01L 21/8242
[52] U.S. Cl. .......................... 438/243; 438/287; 438/692
[58] Field of Search .................................. 437/40 R, 52, 437/60, 919, 47, 48

[56] References Cited

U.S. PATENT DOCUMENTS

| | | | |
|---|---|---|---|
| 4,356,211 | 10/1982 | Riseman | 427/85 |
| 4,420,874 | 12/1983 | Funatsu | 437/68 |
| 4,623,437 | 11/1986 | Visca et al. | 204/157.47 |
| 4,797,373 | 1/1989 | Malhi et al. | 437/162 |
| 4,986,878 | 1/1991 | Malazgirt et al. | 437/61 |
| 5,075,248 | 12/1991 | Yoon et al. | 437/52 |
| 5,078,801 | 1/1992 | Malik | 437/974 |
| 5,217,919 | 6/1993 | Gaul et al. | 437/67 |
| 5,240,875 | 8/1993 | Tsou | 437/72 |
| 5,292,679 | 3/1994 | Anzai | 437/52 |
| 5,313,419 | 5/1994 | Chang | 365/182 |
| 5,316,965 | 5/1994 | Philipossian et al. | 437/70 |
| 5,358,894 | 10/1994 | Fazan et al. | 437/70 |
| 5,391,511 | 2/1995 | Doan et al. | 437/60 |
| 5,397,725 | 3/1995 | Wolstenholm et al. | 437/43 |
| 5,422,294 | 6/1995 | Noble, Jr. | 437/60 |
| 5,448,090 | 9/1995 | Geissler et al. | 257/305 |
| 5,482,869 | 1/1996 | Kohyama | 437/67 |
| 5,489,544 | 2/1996 | Rajeevakumar | 437/60 |
| 5,536,675 | 7/1996 | Bohr | 437/64 |

FOREIGN PATENT DOCUMENTS 242 905 A1  2/1987  Germany.

*Primary Examiner*—Michael Trinh
*Attorney, Agent, or Firm*—Whitham, Curtis, Whitham, & McGinn

[57] ABSTRACT

A Field Effect Transistor (FET) and a method of forming FETs on a silicon wafer. First, trenches are formed in a surface of the silicon wafer. An ONO layer is formed on the surface, lining the trenches. Potassium is diffused along the ONO layer. Part of the ONO layer is removed to expose the wafer surface with the ONO layer remaining in the trenches. A gate oxide is formed on the exposed wafer surface. Finally, FET gates are formed on the gate oxide. Preferably, potassium is introduced during Chem-Mech polish when the trenches are filled with polysilicon. A slurry containing KOH is used to polish the polysilicon and the potassium diffuses from the slurry along the ONO layer. After Chem-Mech polish, the poly in the trenches is recessed by Reactive Ion Etching (RIE) it below the wafer surface. Optionally, after RIE, the wafer may be dipped in a KOH solution. Next, an oxide collar is formed along the ONO layer in the trenches above the recessed polysilicon. The recesses are filled by a second layer of polysilicon that is Chem-Mech polished with the same slurry to remove polysilicon from the wafer surface. The polished polysilicon may be Reactive Ion etched until it is essentially coplanar with the wafer surface. The resulting FET has thicker gate oxide along its sides than in the center of its channel.

9 Claims, 12 Drawing Sheets

| Device Type | Corner $V_t$ (mV) | $I_{ds}$ (μA) | 10μm wide channel $V_t$ (mV) | Retention Ltd Yield for GIDL @256ms |
|---|---|---|---|---|
| Preferred Embodiment | 1005 | 118 | 1210 | 79% |
| Prior Art | 740 | 120 | 1220 | 30% |

FIG. 6

METHOD OF MANUFACTURING AN INSULATED GATE FIELD EFFECT TRANSISTOR

RELATED APPLICATIONS

This application is related to and is being filed concurrently with U.S. Ser. No. 08/688,458, filed Jul. 30, 1996, entitled "An Integrated Circuit Chip", and U.S. Ser. No. 08/688,457, filed Jul. 30, 1996, entitled "An Insulated Gate Field Effect Transistor", both of which are assigned to the Assignee of this application.

FIELD OF THE INVENTION

This invention relates generally to the manufacturing of semiconductor devices, and more particularly to forming a gate oxide on a surface of a semiconductor wafer.

BACKGROUND OF THE INVENTION

High performance and density are primary objectives of Integrated Circuit (IC) chip design. One way chip designers approach both of these objectives is by making devices and device features smaller. The smaller the device feature (and other circuit features), the tighter that circuit devices can be packed together and, consequently, the higher the circuit density. The tighter together the circuit devices are packed, the lower the wiring loads and, consequently, the faster the circuit, i.e., the higher the circuit performance. So, semiconductor process designers concentrate on reducing device features to make devices smaller and smaller.

Just shrinking Field Effect Transistor (FET) channel length alters device characteristics such as punch through voltage and threshold voltage ($V_t$) to the point where the device may be unusable. So, other device parameters such as, channel doping, source/drain doping and gate oxide thickness are altered to compensate for device characteristic changes. Normally, the channel doping profile is altered to compensate for effects of the shorter channel (short channel effects). However, changes in the doping profile raise the $V_t$, so the doping profile change is usually accompanied with a thinner gate oxide to lower the $V_t$. Thinning the gate oxide intensifies the electric field from the gate on the channel. Consequently, gate capacitance per unit area is increased, gate area is decreased, and channel transconductance is increased. Overall, circuit performance improves.

Unfortunately, as device features shrink, what had been considered superficial imperfections for older larger devices are significant flaws. Thinner gate oxide makes devices more susceptible to these flaws causing leakages and defects that reduce chip yield and impair chip reliability. Yield loss related increase in chip cost is easy to quantify because completed wafer cost must be recovered from fewer chips. Reduced reliability related cost, cost from chips failing in normal use, is a more expensive problem. These reliability failures are more expensive because they cause system down time and because of the field cost associated with finding the failing component in an assembled system containing many chips.

FIG. 1 is a cross-sectional representation of an FET built in a 64M DRAM process. There are two deep trenches 100 on either side of the FET 102 that isolate it from adjacent FETs. An oxide collar 104 along the trench 100 sidewalls 106 isolates the FET 102 from polysilicon that fills the trench and is, for example, a Dynamic Random Access Memory (DRAM) cell capacitor storage plate. The gate of the FET 102 is formed by a polysilicon word line 110 that runs across a thin gate oxide layer 112 the width of the FET 102. FET current flow, from drain to source (not shown), is perpendicular to the polysilicon gate and the word line 110.

A depression 114 was formed at each side of the channel when excess oxide was removed from the collar 104. Furthermore, collar 104 oxide formation rounded the channel sides 116. Consequently, the channel 102, while nearly planar in the center, is rounded at its sides 116. The depression 114 and channel 102 rounding at its dies 116 are flaws that were considered superficial artifacts for larger featured FETS. However, for a 64M DRAM process, they are not superficial. Poly in the depression 114 and on the rounded sides 116 enhances the E-field so that it is much more intense there than on the rest of the channel. As a result of this intensified E field, the channel sides 116 have a lower $V_t$ than the rest of the channel 102. So, the channel 102 does not turn on at one uniform gate to source voltage ($V_{gs}$). Instead, the sides 116 turn on before and off after (i.e. with a smaller $V_{gs}$) the rest of the FET 102.

While this condition might be negligible for logic, it is unacceptable for a DRAM pass gates, because it increases pass gate channel leakage. Pass gate channel leakage allows stored charge on the storage plate to dissipate faster. This shortens DRAM retention time, i.e., the length of time that data may be stored in a DRAM cell without it needing to be reinforced or refreshed. Generally, refresh frequency is minimized because during refresh., the DRAM is unaccessible or unavailable. However, a DRAM cell with a short retention time must be refreshed more frequently than a cell with a long retention time. Consequently, a short retention time is undesirable. Thus, it is important to minimize channel leakage and so, to make FETs with planar channels for DRAMs.

PURPOSES OF THE INVENTION

It is a purpose of the invention to reduce FET channel leakage.

It is another purpose of the present invention to reduce channel variations in FET threshold voltage.

It is another purpose of the present invention to increase DRAM cell retention time.

It is yet another purpose of the present invention to reduce FET feature size.

It is yet another purpose of the present invention to reduce FET feature size without reducing DRAM cell retention time.

It is yet another purpose of the invention to reduce FET feature size without increasing channel leakage.

It is yet another purpose of the invention to improve threshold voltage uniformity on reduced feature size FETs.

It is yet another purpose of the invention to reduce channel leakage and variations in threshold voltage without impairing DRAM cell retention time for reduced feature size FETs.

SUMMARY OF THE INVENTION

The present invention is a Field Effect Transistor (FET) and a method of forming the FET on a semiconductor layer of a wafer, preferably a silicon wafer. The method includes the steps of: a) forming trenches in a surface of the silicon wafer; b) forming an etch stop layer, preferably of Oxide-Nitride-Oxide (ONO), on the wafer surface or a pad dielectric stack on the wafer surface such that the ONO layer lines the trenches; c) diffusing an oxidation catalyst, preferably potassium, along the ONO layer; d) exposing the wafer surface, with the ONO layer remaining in the trenches; e)

forming gate oxide on the exposed wafer surface; and, f) forming FET gates on the gate oxide.

Additionally, the potassium may be introduced when the trenches are filled with polysilicon by forming a polysilicon layer on the ONO layer and, then, chemical-mechanical polishing the polysilicon layer with a slurry containing KOH, until polysilicon remains only in the trenches and the potassium diffuses from the slurry into the ONO layer. The polished polysilicon in the trenches is Reactive Ion Etched (RIE) to recess it below the wafer surface. Optionally, after RIE, the wafer may be dipped in a KOH solution. Next, an oxide collar may be formed in the trenches along the ONO layer above the recessed polysilicon. A second layer of polysilicon may be formed on the recessed polysilicon in the trenches so that the second polysilicon layer fills the recessed areas of the trenches. Then, surface polysilicon is chemical-mechanical polished away with a slurry until polysilicon remains only in the trenches. The polished polysilicon may be Reactive Ion etched until it is essentially coplanar with the wafer surface.

BRIEF DESCRIPTION OF THE DRAWINGS

FIG. 6 is a table comprising electrical parameters of FETs, grown according to the prior art with a preferred embodiment FET.

DESCRIPTION OF THE PREFERRED EMBODIMENTS

The present invention is an FET and the process of forming the FET. The FET of the present invention has a thicker gate oxide along channel sides than on the interior of the channel. A layer of silicon Oxide-silicon Nitride-silicon Oxide (ONO) formed at the sides of the channel region includes a catalyst that enhances local oxide formation. The preferred catalyst is potassium.

Figure 1:
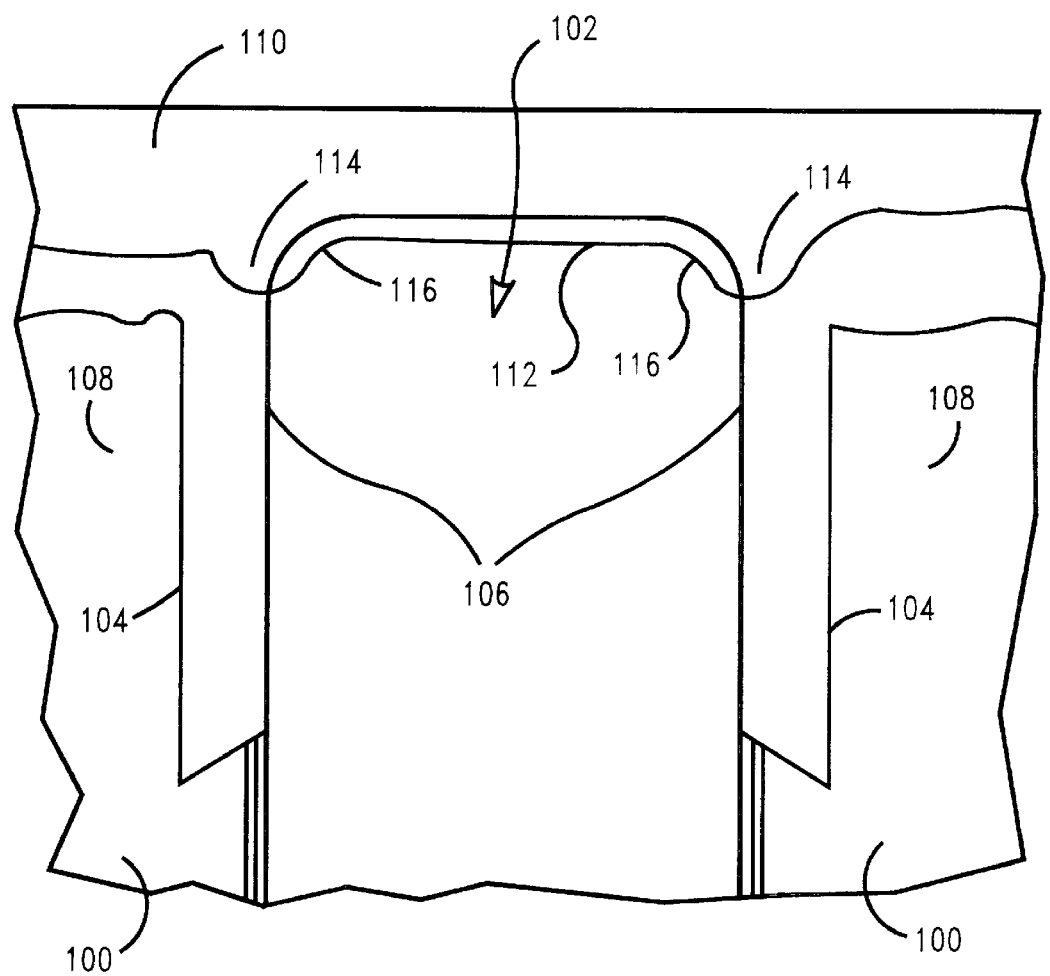
FIG. 1 is a cross-sectional representation of an FET in a DRAM made by a prior art manufacturing process.
Figure 2A:
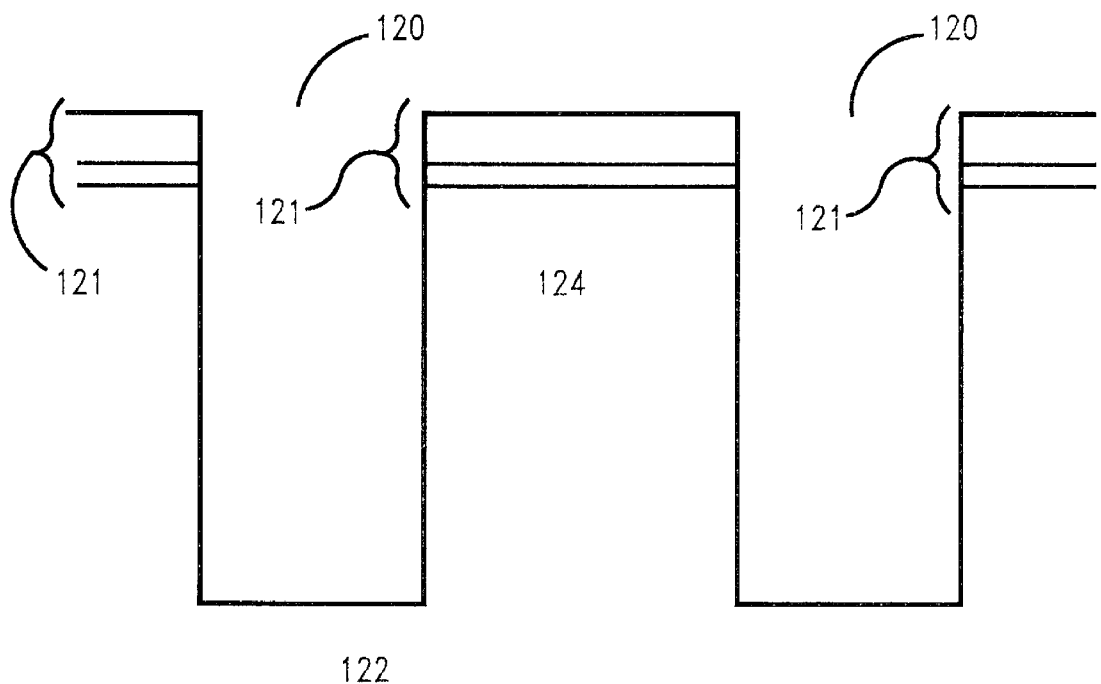
FIGS. 2A–F represent the steps in forming a preferred embodiment FET.

FIGS. 2A–F represent the steps in forming the preferred embodiment FET which is essentially as depicted in FIG. 2F. First, in FIG. 2A, deep trenches 120 are formed in a semiconductor layer (or wafer) 122. Prior to forming trenches 120, a pad dielectric stack, represented by layer stack 121, is formed on the semiconductor layer 122. The trenches 120 are etched through the pad stack 121 and into the wafer 122 to isolate and define an FET region 124. A channel, source and drain will be formed in this defined FET region 124. Preferably, the semiconductor layer is silicon. In the preferred embodiment, the FET, when complete, is a passgate transistor of a Dynamic Random Access Memory (DRAM) cell. The DRAM cell's storage capacitor plate is formed in the trench 120.

Figure 2B:
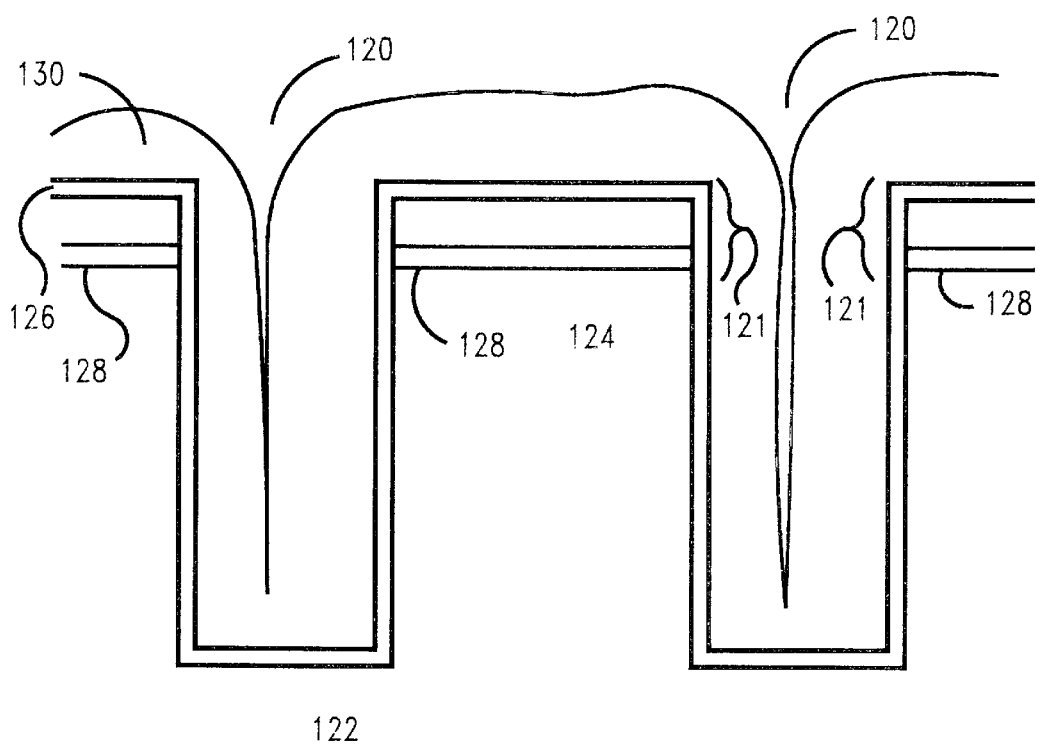
Figure 2:
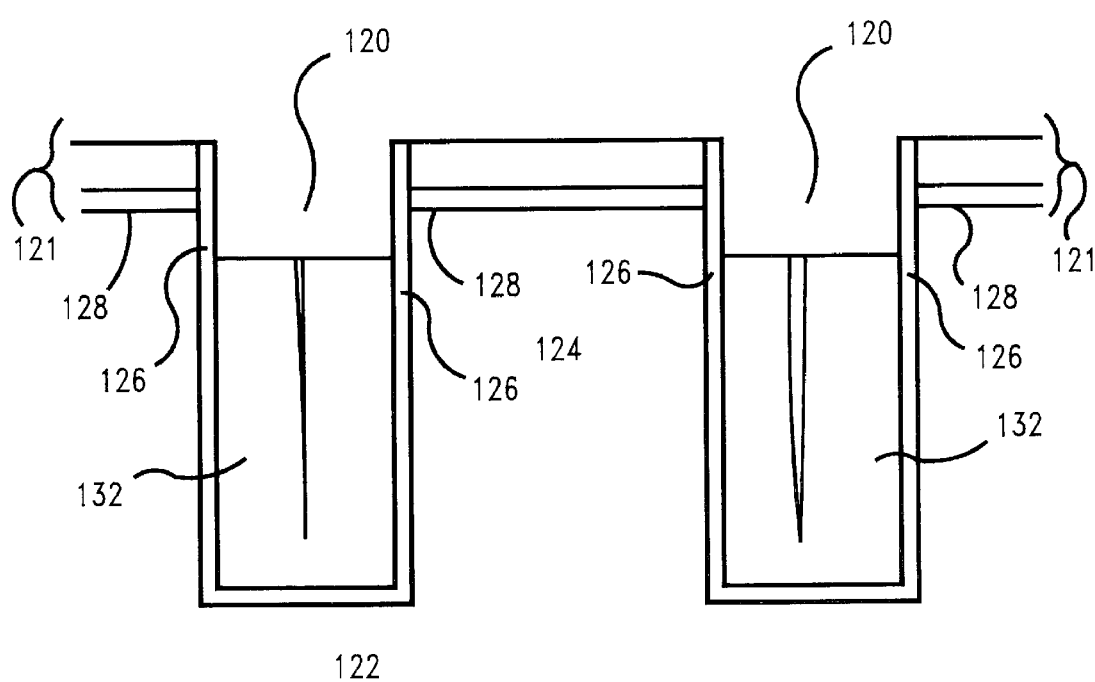
Figure 2:
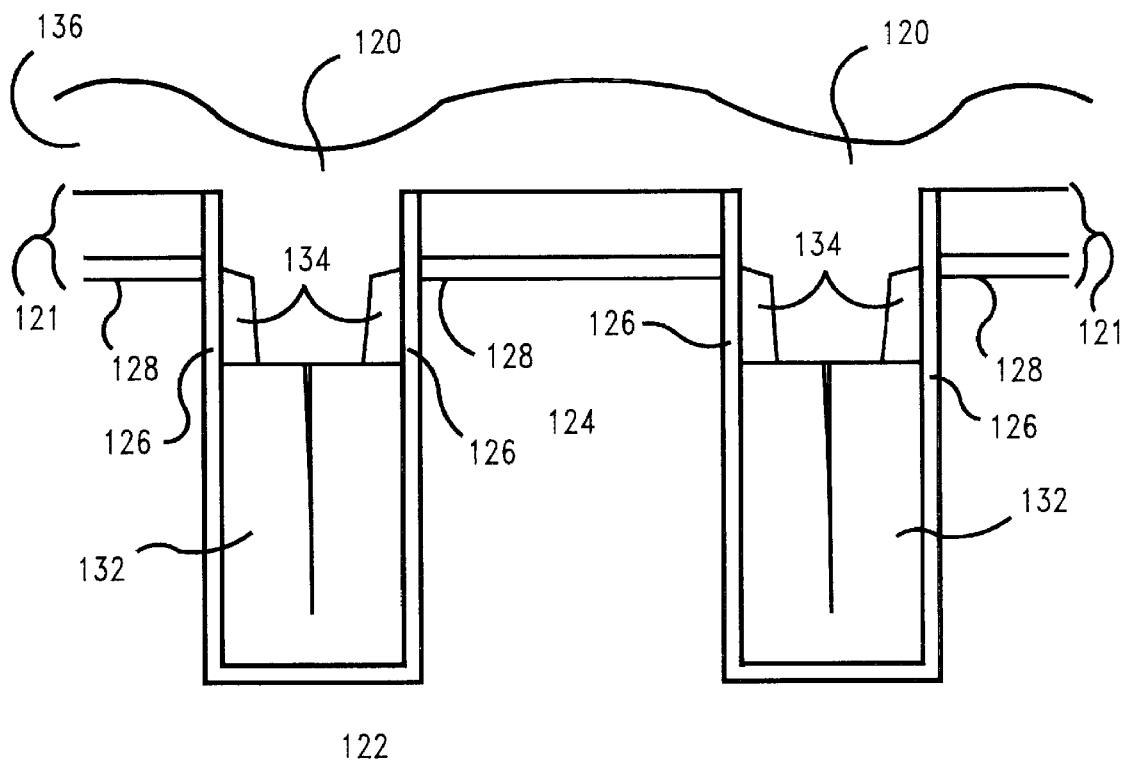
Figure 2:
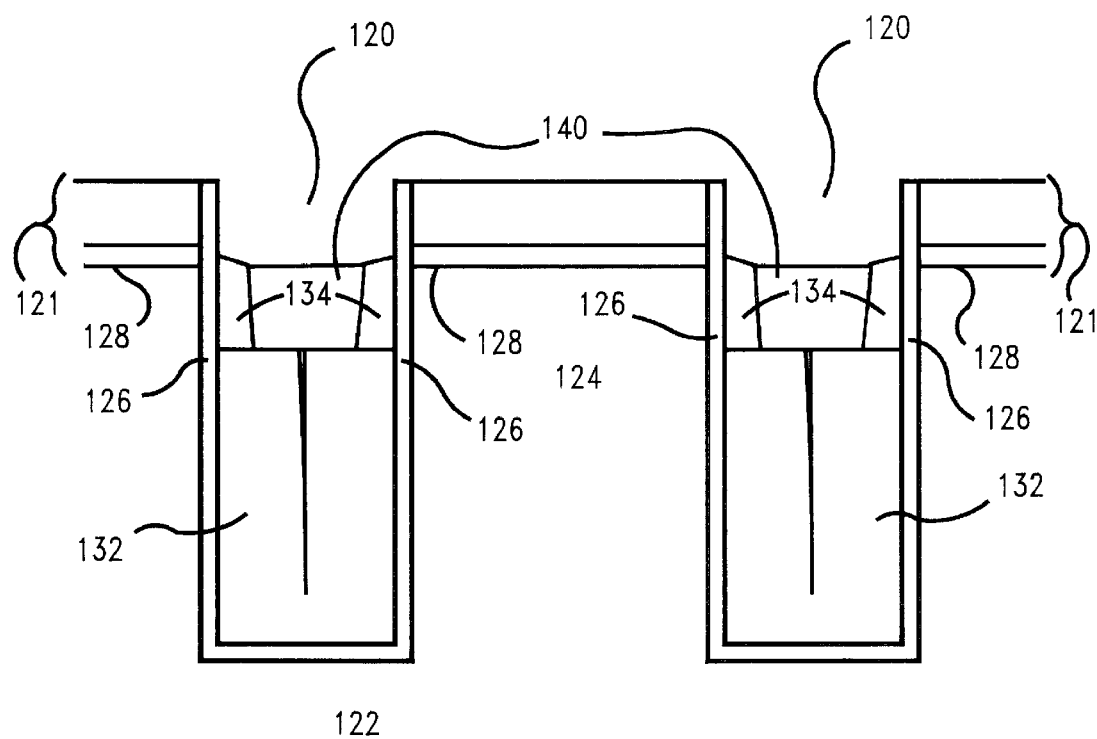
Figure 2:
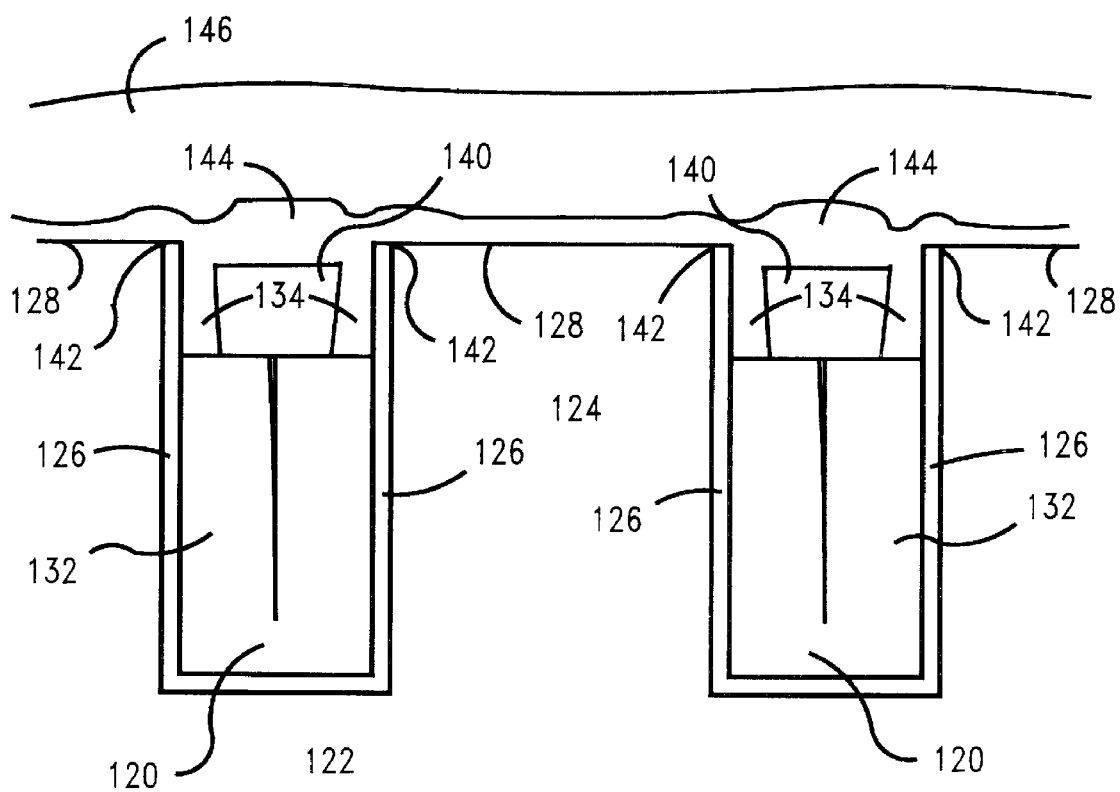

In FIG. 2B, an ONO layer 126 is conformally formed on the pad stack 121 and in trenches 120. Although referred to as a single layer, it is understood that the ONO layer 126 is a thin nitride layer sandwiched between two thin oxide layers. The ONO layer 126 lines the trenches 120, extending vertically along the sides of each trench 120 past the surface 128 of the wafer 122 and along the pad stack 121. Next, an $N^+$ polysilicon (poly) layer 130 is deposited on the ONO layer 126.

In FIG. 2C, the polysilicon layer 130 is removed from above the pad stack 121 so that polysilicon 132 remains only in the trenches 120. Preferably, the polysilicon layer 130 is removed using Chemical-Mechanical Polish (CMP). Polishing the polysilicon layer 130 also removes most of the ONO layer 126 lying on the pad stack 121 such that ONO remains mainly in the trenches 120. After CMP, residual ONO layer 130 is removed from the pad stack 121. Then, the remaining polysilicon 130 is etched by Reactive Ion Etching (RIE) such that the remaining poly 132 in the trenches is recessed beneath the wafer surface 128, preferably, by 1.3 $\mu$m. The preferred slurry for removing the poly layer 130 is a poly slurry in Potassium Hydroxide, preferably <0.1% KOH. The silicon nitride in the ONO layer 126 is a diffusion barrier to the potassium in the slurry. So, potassium diffuses into the ONO layer 126, through the outer oxide and collects at the nitride. Optionally, to enhance the level of collected potassium, the wafer may be dipped in a tank of KOH solution.

These steps of polishing the poly layer 130 with a slurry containing KOH and the optional dip are contrary to conventional semiconductor chip manufacturing practices. Normally, such a use of potassium is avoided in semiconductor chip manufacture because potassium readily diffuses into silicon. Therefore, using a KOH slurry would, effectively, poison the silicon, making it unusable for forming FETs. However, the ONO layer 126 blocks diffusion of the potassium and instead, collects the potassium along the interface between the outer oxide and the nitride.

Next, in FIG. 2D, an oxide collar 134 is selectively formed in the trenches 120 on the poly 132, along the ONO layer 126. After forming the collars 134, another $N^+$ poly layer 136 is formed on the wafer 122. This second poly layer 136 re-fills the trenches 120 with polysilicon.

In FIG. 2E, the poly layer 136 is removed from the pad stack 121 using CMP and RIE such that poly 140 remains only in the trenches 120. The poly 140 in the trenches 120 is coplanar with, or, slightly recessed from the wafer surface 128. As in the previous poly removal step, the preferred slurry is a poly slurry with <0.1% KOH. A screen oxide layer (not shown) is grown in dry $O_2$ on the exposed pad stack 121 and poly 140, taking care to avoid removing the potassium from along the ONO layer 126. Then, N or P wells (if required) are defined. Next an appropriate dopant(s) is (are) ion implanted for channel tailoring. Then, the implanted dopant is diffused to the wafer as desired to bulk dope the silicon substrate 122.

After diffusing the implanted dopants, the screen oxide layer and pad stack layers 121 are removed and gate oxide may be grown. The potassium along the ONO layer 126 in the trenches 120 that was collected by the nitride is a catalyst for silicon oxidation. So, as depicted in FIG. 2F, the gate oxide is thicker along the sides 142 of the channel, i.e., in close proximity to the ONO layer 126.

Next, isolation oxide 144 is selectively grown to isolate the poly 140 in the trenches 128 from subsequent conductive layers. Finally, the poly word line layer 146 is deposited. The poly word line layer 146 is patterned by any well-known lithographic method. Subsequent chip layers are formed and patterned to complete the chip using methods normally used in integrated circuit chip manufacture.

Additionally, part of ONO layer may be removed from trenches in the vicinity of selected FETs, such as in non-array areas, prior to growing gate oxide. This may be done, for example, by selectively etching the ONO layer away when shallow trenches (shallower than array isolation trenches 120) are formed for shallow trench isolation. Thus, two types of FETs are formed. FETs in array areas would be preferred embodiment enhanced gate oxide FETs; while FETs in non-array areas (or whenever the ONO layer is removed) would have unenhanced, essentially uniform gate oxide layers.

EXAMPLES

Figure 3:
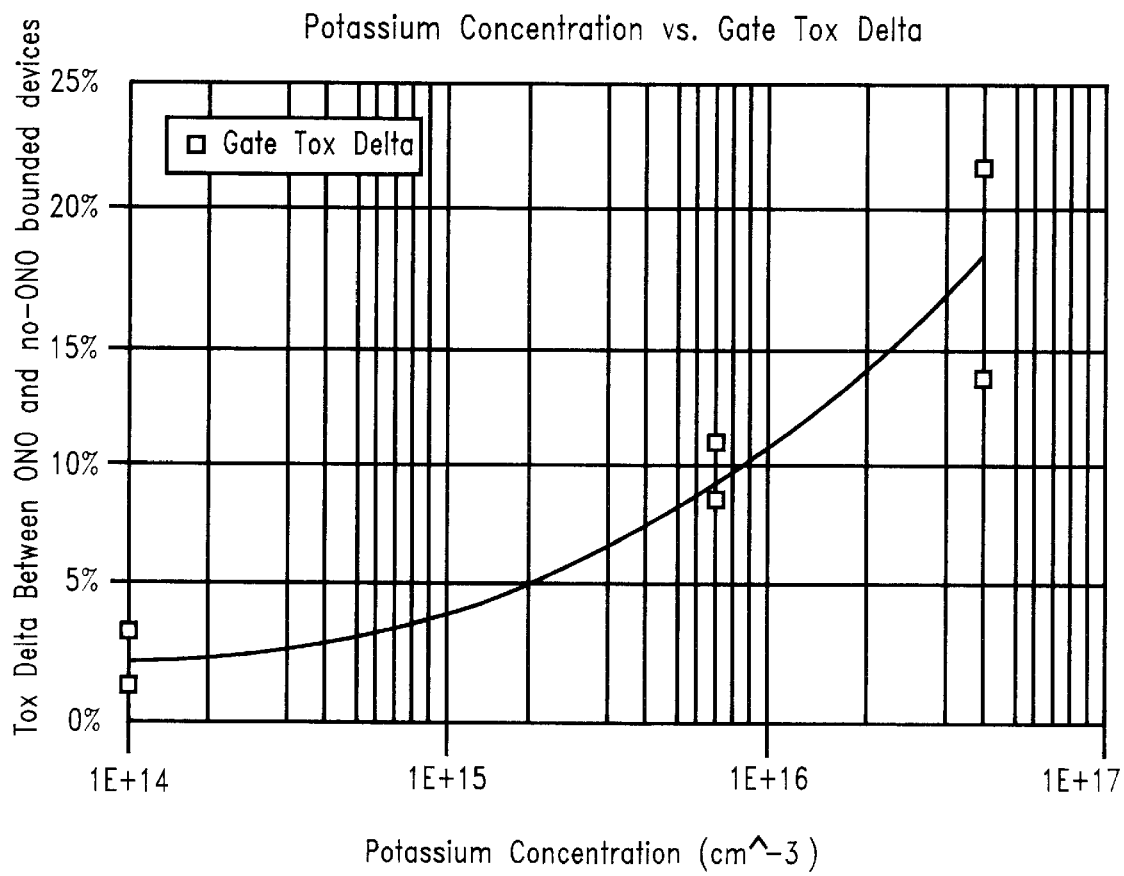
FIG. 3 is a plot of oxide thickness $T_{ox}$ versus Potassium concentrate.

FIG. 3 is a plot of increase in oxide ($T_{ox}$) thickness verses Potassium concentrate. Increasing the level of accumulated potassium increases the gate oxide thickness at the channel sides. Further, this increase in gate oxide thickness extends horizontally from the sides into the channel. The extent of the increased oxide thickness, both vertically and horizontally is dependent upon the level of potassium collected in the ONO layer. If the accumulated potassium level is increased sufficiently then, the gate oxide thickens across the entire device. The increase in thickness is inversely proportional to the horizontal distance from the ONO layer 126 (i.e. from the potassium catalyst).

In addition, growth temperature and growth media affect the amount of increase in local oxide thickness derived from the presence of potassium catalyst. The side to center oxide thickness difference is much more pronounced, i.e., much thicker at the device sides than in the device center, for gate oxide grown at 900° C. in dry $O_2$ than for gate oxide grown at 800° C. in wet $O_2$.

Figure 4:
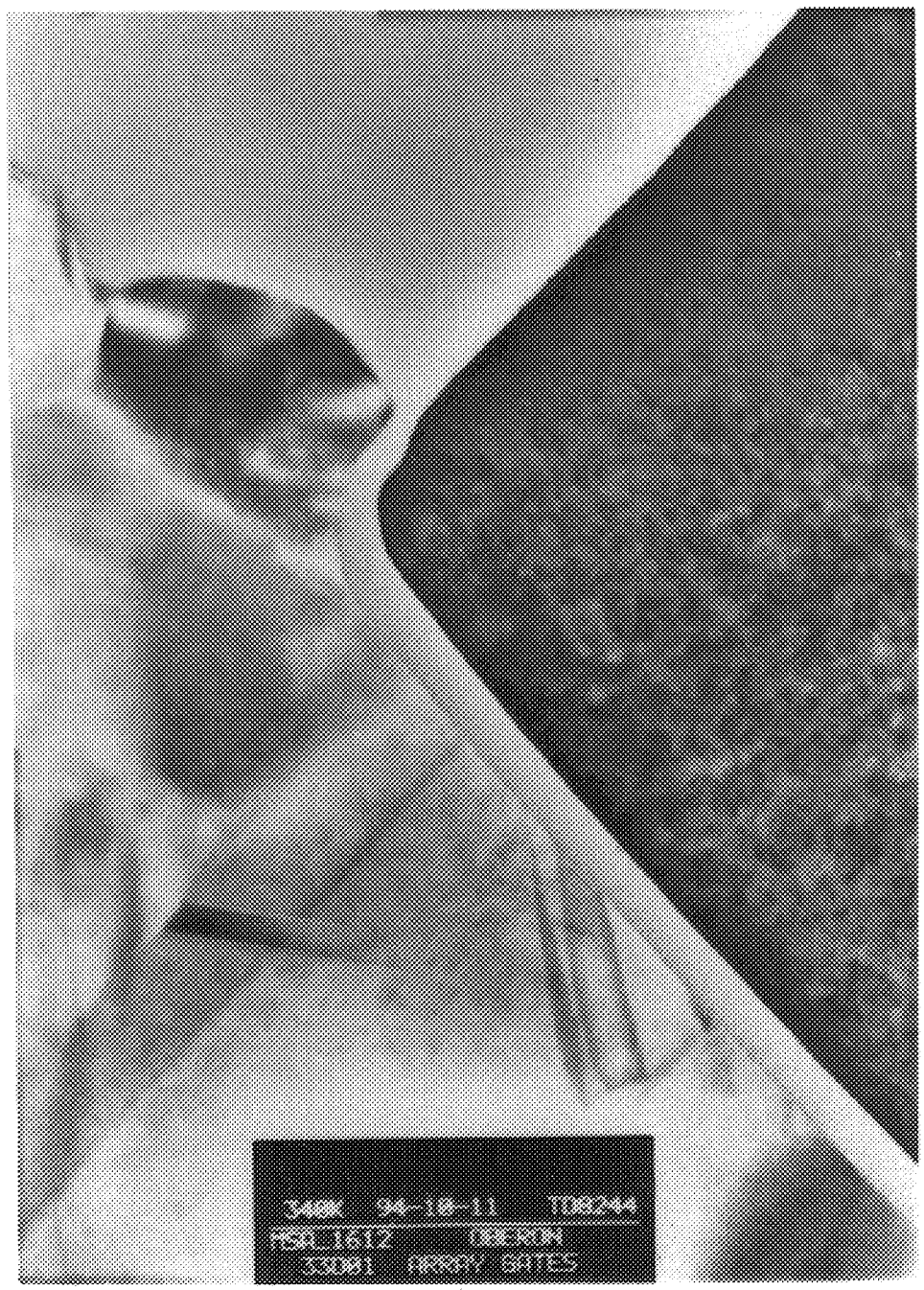
FIG. 4 is an image from a Transmission Electron Microscope (TEM) at a corner of an FET grown according to a prior art method.

FIG. 4 is a Transmission Electron Microscope (TEM) image of an FET corner (a cross-section at a side) grown according to the prior art at 900° C. in $O_2$. For this prior art FET, corner $T_{ox}$ ($T_{ox}$ along the side of the channel) is 8% thinner than center $T_{ox}$ (in the center of the channel). Thus, this prior art FET has a lower corner $V_t$ due to this thinner corner $T_{ox}$ and due to the more intense E-field from the poly both horizontally along the top channel area and vertically along the side (in the trench).

Figure 5A:
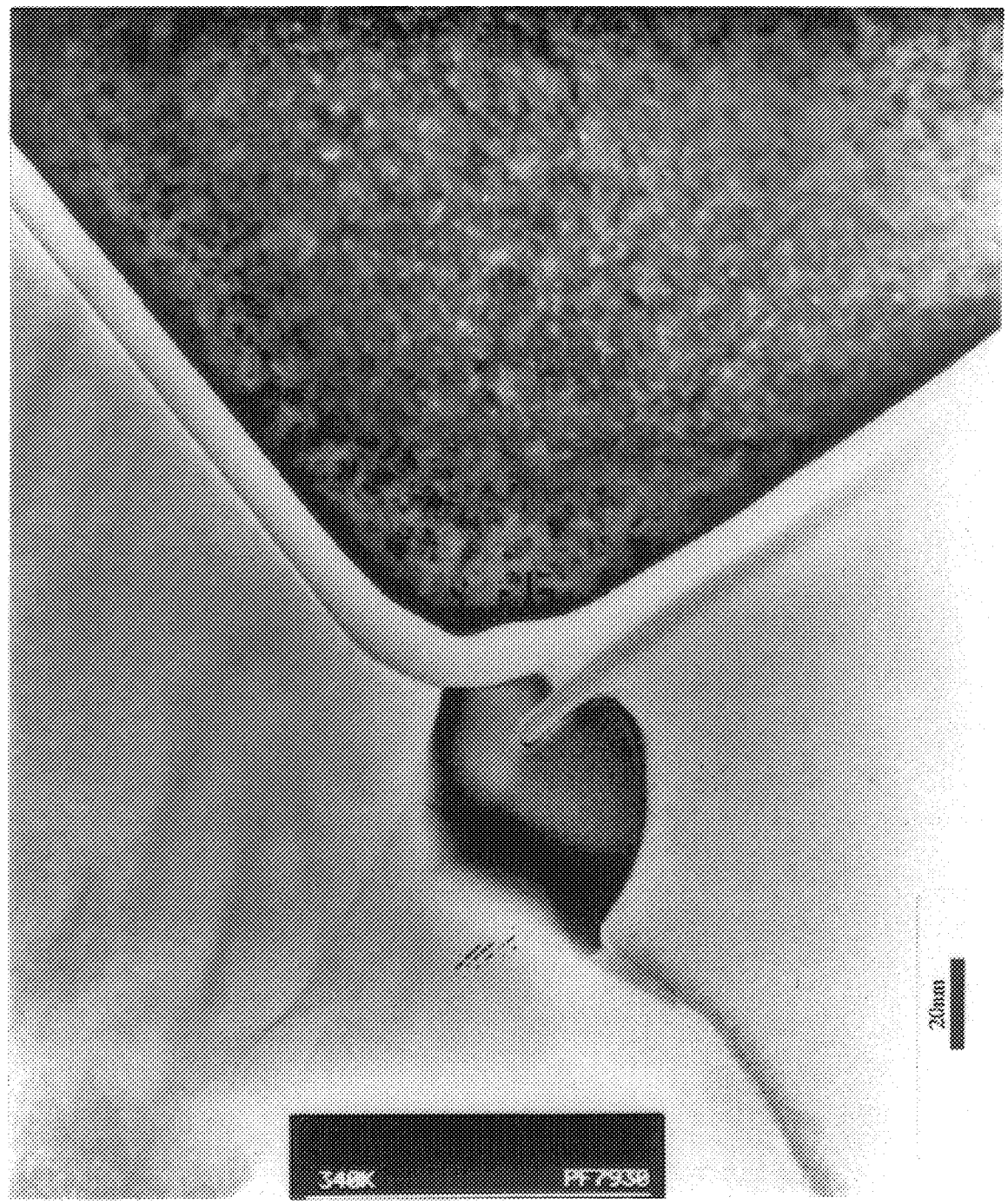
FIGS. 5A–B are TEM images of FETs grown according to the present invention.

FIG. 5A is a TEM image of an FET corner grown at 800° C. in wet $O_2$ according to the present invention. For this preferred embodiment FET, corner $T_{ox}$ is 30% thicker center $T_{ox}$. Thus, the $V_t$ is elevated along the channel sides over that of the prior art FET. Further, the E-field is attenuated somewhat by the thicker corner $T_{ox}$.

Figure 5B:
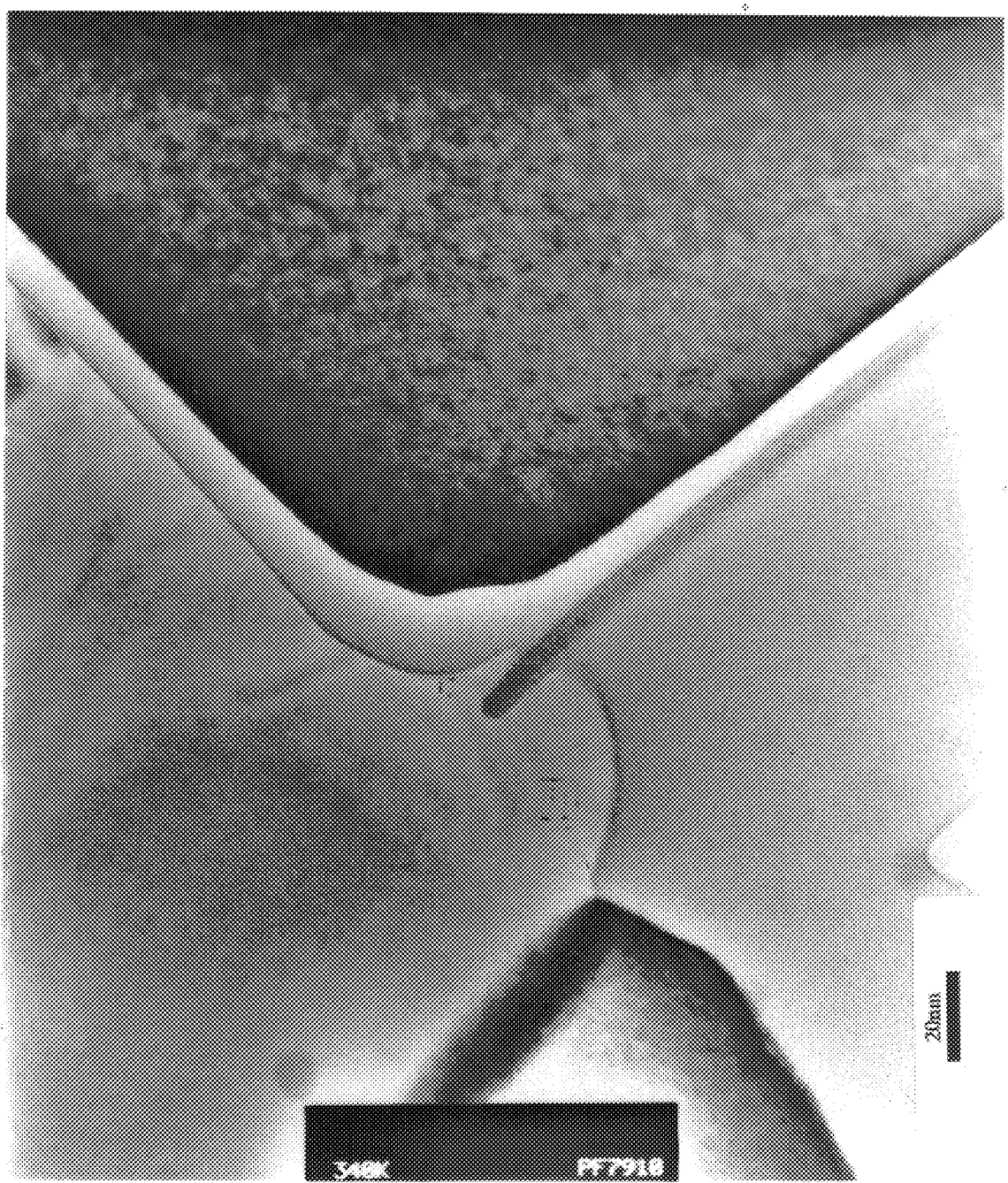

FIG. 5B is a TEM image of a preferred embodiment FET corner grown at 900° C. in dry $O_2$. For this preferred embodiment FET, the corner $T_{ox}$ is 70% thicker than center $T_{ox}$. The thickened oxide along the side of this preferred FET raises the corner $V_t$ nearly to that of the center channel $V_t$.

The table of FIG. 6 is a comparison of a prior art 10 $\mu$m wide FET's electrical parameters with a preferred embodiment 10 $\mu$m FET, each grown at the chip location on different wafers under nearly identical conditions. Although both devices have a nearly identical center channel $V_t$ and nearly identical on current (Ids), the corner $V_t$ of the preferred FET is nearly equal to the center channel $V_t$. By contrast, the corner $V_t$ of the prior art FET is 75% that of the corner $V_t$ of the preferred embodiment FET. So, for the preferred embodiment device, the retention yield at 256 ms (the time that charge is held in a cell) is more than 2.6 times that of the prior art FET.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. A method of forming Field Effect Transistors (FETS) on a semiconductor layer of a wafer comprising the steps of:
    a) forming trenches in a surface of said semiconductor layer;
    b) forming a pad dielectric stack on said surface of said semiconductor layer;
    c) forming an Oxide-Nitride-Oxide (ONO) layer on said pad dielectric stack and in said trenches whereby said ONO layer lines said trenches;
    d) forming a layer of conductive material on said ONO layer where located on said pad dielectric stack surface and in said trenches;
    e) removing portions of said layer of conductive material and said ONO layer where located on said pad dielectric stack;
    f) diffusing an oxidation catalyst into and along said ONO layer in said trenches;
    g) removing said pad dielectric stack to expose said surface of said semiconductor layer, said ONO layer remaining in said trenches;
    h) forming a gate oxide on said exposed surface of said semiconductor layer, wherein thickness of said gate oxide is inversely proportional to horizontal distance of said gate oxide from said ONO layer; and
    i) forming FET gates on said gate oxide.

2. The method of claim 1 wherein the step f) of diffusing the oxidation catalyst comprises the step of
    chemical-mechanical polishing said conductive material layer with a slurry containing said oxidation catalyst, said conductive material layer remaining only in said trenches and said oxidation catalyst diffusing from said slurry into said ONO layer.

3. The method of claim 2 wherein the step f) of diffusing the oxidation catalyst further comprises the step of
    reactive ion etching said conductive material layer such that said polished conductive material layer remaining in said trenches is recessed below said surface of said semiconductor layer.

4. The method of claim 3 wherein the step f) of diffusing the oxidation catalyst further comprises the steps of:
    forming an oxide collar in said trenches along said ONO layer above said recessed conductive material layer, said oxide collar defining central openings in said trenches above said recessed polysilicon;
    forming a second layer of a conductive material on said recessed conductive material, said second conductive material layer filling said openings in said trenches above said recessed polysilicon; and
    chemical-mechanical polishing said second conductive material layer with said slurry until said conductive material from said second layer remains only in said trenches.

5. The method of claim 4 wherein the step f) of diffusing the oxidation catalyst further comprises the step of:
    reactive ion etching said second polished conductive material layer until said second polished conductive material layer is essentially coplanar with said semiconductor layer surface.

6. The method of claim 3 wherein the step f) of diffusing the oxidation catalyst further comprises the step of:

dipping said wafer into a solution containing said oxidation catalyst.

7. The method of claim 5 wherein the step f) of diffusing the oxidation catalyst further comprises the step of:
dipping said wafer into a solution containing said oxidation catalyst.

8. The method of claim 4 wherein the semiconductor layer is a silicon layer and the oxidation catalyst is potassium.

9. The method of claim 4 wherein said conductive material is doped polysilicon.

* * * * *